(12) United States Patent
Li (10) Patent No.: US 12,218,090 B2
(45) Date of Patent: Feb. 4, 2025

(54) SEMICONDUCTOR PACKAGING METHOD, SEMICONDUCTOR ASSEMBLY AND ELECTRONIC DEVICE COMPRISING SEMICONDUCTOR ASSEMBLY

(71) Applicant: Yibu Semiconductor Co., Ltd., Shanghai (CN)

(72) Inventor: Weiping Li, Shanghai (CN)

(73) Assignee: Yibu Semiconductor Co., Ltd., Shanghai (CN)

( * ) Notice: Subject to any disclaimer, the term of this patent is extended or adjusted under 35 U.S.C. 154(b) by 448 days.

(21) Appl. No.: 17/562,944

(22) Filed: Dec. 27, 2021

(65) Prior Publication Data

US 2022/0208709 A1   Jun. 30, 2022

(30) Foreign Application Priority Data

Dec. 25, 2020 (CN) .......................... 202011559060.9
Dec. 25, 2020 (CN) .......................... 202011573447.X (51) Int. Cl.
*H01L 23/00* (2006.01)
*H01L 21/56* (2006.01)
(Continued)

(52) U.S. Cl.
CPC ............ *H01L 24/11* (2013.01); *H01L 21/561* (2013.01); *H01L 21/568* (2013.01);
(Continued)

(58) Field of Classification Search
CPC ..... H01L 24/11; H01L 21/561; H01L 21/568; H01L 23/3107; H01L 23/49822;
(Continued)

(56) References Cited

U.S. PATENT DOCUMENTS 5,399,898 A   3/1995 Rostoker
5,600,180 A   2/1997 Kusaka
(Continued)

FOREIGN PATENT DOCUMENTS

CN   1949499 A   4/2007
CN   102148173 A   8/2011
(Continued)

OTHER PUBLICATIONS

Shanghai Yibu Semiconductor Co., Ltd., English Translation of KR First Office Action, KR 10-2022-0074762, Mar. 28, 2023, 7 pgs.
(Continued)

*Primary Examiner* — Mohammad M Choudhry
(74) *Attorney, Agent, or Firm* — USCH Law, PC

(57) ABSTRACT

A semiconductor packaging method, a semiconductor assembly and an electronic device are disclosed herein. The semiconductor packaging method comprises providing at least one semiconductor device and a first carrier board. The at least one semiconductor device has a passive surface with first alignment solder parts formed thereon, and the first carrier board has a plurality of corresponding second alignment solder parts formed thereon. The method further comprises forming alignment solder joints by aligning and soldering the first alignment solder parts to respective ones of the second alignment solder parts; removing the first carrier board after attaching a second carrier board to the active surface of the at least one semiconductor device; forming a molded package body on one side of the second carrier board to encapsulate the at least one semiconductor device; and removing the second carrier board to expose the connecting terminals.

18 Claims, 6 Drawing Sheets

Before chip drift and rotation

After chip drift and rotation

Ideal UBM Position —

UBM —

RDL Trace —

(51) Int. Cl.
 *H01L 23/31* (2006.01)
 *H01L 23/498* (2006.01)

(52) U.S. Cl.
 CPC .... *H01L 23/3107* (2013.01); *H01L 23/49822* (2013.01); *H01L 24/13* (2013.01); *H01L 24/96* (2013.01); *H01L 2224/11003* (2013.01); *H01L 2224/11005* (2013.01); *H01L 2224/13023* (2013.01)

(58) Field of Classification Search
 CPC ............... H01L 24/13; H01L 24/96; H01L 2224/11005; H01L 2224/13023
 See application file for complete search history.

(56) References Cited

U.S. PATENT DOCUMENTS

| | | | |
|---|---|---|---|
| 6,809,421 | B1 | 10/2004 | Hayasaka |
| 7,446,419 | B1 * | 11/2008 | Lin ..................... H01L 21/6835 438/106 |
| 10,504,826 | B1 | 12/2019 | Fillion et al. |
| 10,847,435 | B2 | 11/2020 | Kim et al. |
| 2003/0000738 | A1 | 1/2003 | Rumsey et al. |
| 2003/0062631 | A1 * | 4/2003 | Nemoto ................. H01L 24/48 257/784 |
| 2004/0262774 | A1 | 12/2004 | Kang |
| 2006/0177965 | A1 | 8/2006 | Senda |
| 2007/0126111 | A1 | 6/2007 | Mirsky et al. |
| 2007/0205520 | A1 | 9/2007 | Chou et al. |
| 2008/0284408 | A1 | 11/2008 | Kunst et al. |
| 2009/0039526 | A1 | 2/2009 | Wang et al. |
| 2009/0057866 | A1 | 3/2009 | Chow |
| 2009/0130838 | A1 * | 5/2009 | Sakaguchi ............ H01L 24/81 438/613 |
| 2011/0071397 | A1 | 3/2011 | Wodnicki et al. |
| 2011/0074004 | A1 | 3/2011 | Shen |
| 2012/0032321 | A1 | 2/2012 | West |
| 2012/0146216 | A1 * | 6/2012 | Kang ..................... H01L 23/147 257/737 |
| 2013/0059416 | A1 | 3/2013 | Liu et al. |
| 2013/0234317 | A1 | 9/2013 | Chen et al. |
| 2013/0244382 | A1 | 9/2013 | Clark |
| 2013/0248237 | A1 | 9/2013 | Zhou |
| 2015/0255415 | A1 | 9/2015 | De Bonis |
| 2017/0358554 | A1 | 12/2017 | Chen et al. |
| 2019/0103375 | A1 | 4/2019 | Huang |
| 2020/0006241 | A1 | 1/2020 | Wu et al. |
| 2020/0161183 | A1 | 5/2020 | Lai et al. |
| 2020/0321234 | A1 | 10/2020 | Choi et al. |
| 2020/0365547 | A1 | 11/2020 | Yang et al. |

FOREIGN PATENT DOCUMENTS

| | | |
|---|---|---|
| CN | 102194718 A | 9/2011 |
| CN | 103295991 A | 9/2013 |
| CN | 103890933 A | 6/2014 |
| CN | 103915355 A | 7/2014 |
| CN | 104037153 A | 9/2014 |
| CN | 104380465 A | 2/2015 |
| CN | 104505351 A | 4/2015 |
| CN | 102983087 B | 6/2015 |
| CN | 105244341 A | 1/2016 |
| CN | 105448862 A | 3/2016 |
| CN | 108028239 A | 5/2018 |
| CN | 109585312 A | 4/2019 |
| CN | 112018047 A | 12/2020 |
| JP | 06112463 A | 4/1994 |
| JP | H06112463 A | 11/1999 |
| JP | H11317468 A | 11/1999 |
| JP | 2004253598 A | 9/2004 |
| JP | 2005236232 A | 9/2005 |
| JP | 2007189066 A | 7/2007 |
| JP | 2007329503 A | 12/2007 |
| JP | 2008171879 A | 7/2008 |
| JP | 2011071259 A | 4/2011 |
| KR | 20140070602 A | 6/2014 |
| KR | 20170026170 A | 2/2019 |
| TW | 521411 B | 2/2003 |
| TW | 200531234 A | 9/2005 |
| TW | 201032307 A | 9/2010 |
| TW | 201225193 A | 6/2012 |
| TW | M507066 U | 8/2015 |
| TW | I578421 B | 4/2017 |
| TW | 201917835 A | 5/2019 |
| TW | 201921620 A | 6/2019 |
| TW | 202101635 A | 1/2021 |
| TW | 202103249 A | 1/2021 |
| TW | 202133279 A * | 9/2021 ............. H01L 21/56 |

OTHER PUBLICATIONS

Shanghai Yibu Semiconductor Co., Ltd., KR First Office Action with English Translation, KR 10-2021-01640040, Mar. 29, 2023, 11 pgs.
Shanghai Yibu Semiconductor Co., Ltd., KR Second Office Action with English Translation, KR 10-2021-01640040, Nov. 26, 2023, 13 pgs.
Shanghai Yibu Semiconductor Co., Ltd., KR First Office Action with English Translation, KR 10-2021-0164048, Nov. 6, 2023, 11 pgs.
Weiping Li, U.S. Appl. No. 17/535,983, Non-Final Office Action issued Jun. 30, 2023.
Weiping Li, U.S. Appl. No. 17/535,986, Non-Final Office Action issued Jul. 20, 2023.
Weiping Li, U.S. Appl. No. 17/568,293, Non-Final Office Action issued Jul. 17, 2023.
Weiping Li, U.S. Appl. No. 17/568,293, Final Office Action issued Dec. 20, 2023.
Yibu Semiconductor (Shanghai) Co., Ltd., First Office Action, CN 202011573447.X, Mar. 1, 2022, 11 pgs.
Yibu Semiconductor (Shanghai) Co., Ltd., Notice of reexamination, CN 202011573447.X, Apr. 18, 2023, 9 pgs.
Yibu Semiconductor (Shanghai) Co., Ltd., Search Report, TW 110147931, Jul. 19, 2022, 1 pg.
Yibu Semiconductor (Shanghai) Co., Ltd., First Office Action , TW 110147931, Jul. 19, 2022, 2 pgs.
Yibu Semiconductor (Shanghai) Co., Ltd., Second Office Action, TW 110147931, Oct. 17, 2022, 2 pgs.
Yibu Semiconductor (Shanghai) Co., Ltd., First Office Action, CN 202011559060.9, Jun. 30, 2023, 6 pgs.
Yibu Semiconductor (Shanghai) Co., Ltd., Search Report, TW 110147932, Nov. 18, 2022, 1 pg.
Yibu Semiconductor (Shanghai) Co., Ltd., First Office Action, TW 110147932, Nov. 18, 2022, 2 pgs.
Yibu Semiconductor (Shanghai) Co., Ltd., First Office Action, CN 202110062475.3, Jul. 8, 2023, 17 pgs.
Yibu Semiconductor (Shanghai) Co., Ltd., Notice of reexamination, CN 202110062475.3, Dec. 19, 2023, 13 pgs.
Yibu Semiconductor (Shanghai) Co., Ltd., Search Report, TW 111101834, Sep. 30, 2022, 1 pg.
Yibu Semiconductor (Shanghai) Co., Ltd., First Office Action, TW 111101834, Sep. 30, 2022, 33 pgs.
Yibu Semiconductor (Shanghai) Co., Ltd., First Office Action, CN 202110137354.0, Jun. 29, 2023, 8 pgs.
Yibu Semiconductor (Shanghai) Co., Ltd., First Office Action, TW 111102528, Aug. 5, 2022, 2 pgs.
Yibu Semiconductor (Shanghai) Co., Ltd., Search Report, TW 111102528, Aug. 5, 2022, 2 pgs.
Weiping Li, U.S. Appl. No. 17/535,986, Response to Non-Final Office Action filed Oct. 20, 2023.
Weiping Li, U.S. Appl. No. 17/535,986, Notice of Allowance issued Feb. 13, 2024.

* cited by examiner

310
Providing at least one semiconductor device and a first carrier board, wherein each of the at least one semiconductor device respectively has an active surface and an opposing passive surface, the active surface is formed with connecting terminals, the passive surface is formed with a plurality of first alignment solder parts, and the first carrier board is formed with a plurality of second alignment solder parts respectively corresponding to the plurality of first alignment solder parts

320
Placing the at least one semiconductor device on the first carrier board such that the plurality of first alignment solder parts are substantially aligned with respective ones of the plurality of second alignment solder parts

330
Forming a plurality of alignment solder joints by soldering the plurality of first alignment solder parts to respective ones of the plurality of second alignment solder parts to align and fix the at least one semiconductor device to the first carrier board

340
Removing the first carrier board after attaching a second carrier board to the active surface of the at least one semiconductor device

350
Forming a molded package body on a side of the second carrier board where the at least one semiconductor device is disposed, the molded package body encapsulating the at least one semiconductor device

360
Removing the second carrier board to expose the connecting terminals from the molded package body

SEMICONDUCTOR PACKAGING METHOD, SEMICONDUCTOR ASSEMBLY AND ELECTRONIC DEVICE COMPRISING SEMICONDUCTOR ASSEMBLY

CROSS REFERENCE TO RELATED APPLICATIONS

This application claims the benefit of priority under the Paris Convention to Chinese Patent Application No. 202011559060.9, filed Dec. 25, 2020, entitled "Semiconductor Packaging Method, Semiconductor Assembly and Electronic Device Comprising Semiconductor Assembly," and Chinese Patent Application No. 202011573447.X, filed Dec. 25, 2020, entitled "Semiconductor Packaging Method, Semiconductor Assembly and Electronic Device Comprising Semiconductor Assembly," each of which is incorporated by reference herein in its entirety. This application is related to co-pending U.S. patent application Ser. No. 17/535,983, filed Nov. 26, 2021, U.S. patent application Ser. No. 17/535,986, filed Nov. 26, 2021, and U.S. patent application Ser. No. 17/562,939, entitled "Semiconductor Packaging Method, Semiconductor Assembly and Electronic Device Comprising Semiconductor Assembly," filed on even date herewith, each of which is incorporated by reference herein in its entirety.

FIELD OF THE INVENTION

The present application relates to the technical field of semiconductor manufacturing, in particular to a semiconductor packaging method, a semiconductor assembly and electronic device comprising the semiconductor assembly.

BACKGROUND

Semiconductor packages and systems that are compact, small, lightweight, and thin in design, while at the same time achieving high integration and versatility in function, are constantly being sought. Currently, various packaging technologies are proposed to meet the above-mentioned technical requirements, such as fan-out wafer level packaging, small chip packaging (chipset), heterogeneous integration, and 2.5-dimensional (2.5D) or three-dimensional (3D) packaging. These packaging techniques have different advantages and characteristics, but all present some technical challenges. Taking the existing fan-out package as an example, it faces many technical problems, such as warpage, chip shift (die shift), surface flatness (topography), non-coplanarity between the chip and the molded package body (chip-to-mold non-planarity), package reliability (reliability), etc. Despite the continuing efforts in the industry to improve these technical problems by improving the equipment, materials, process elements, there is no economical and effective solution to some of the technical problems, especially problems such as warpage, chip drift, and surface coplanarity between different chips.

In addition, there are common techniques involved in the fabrication of various high-end semiconductor packages and systems, often involving the placement and attachment of semiconductor devices with high precision. This process step is usually performed by a high precision mounting (pick and place or die binder) equipment, which is very expensive. Still, the mounting speed is limited, resulting in low production speed, which becomes a bottleneck for the development and popularization of the technology.

The present application include some embodiments directed to solving several of the core technical problems set forth above.

SUMMARY

Certain embodiments are directed to a novel semiconductor packaging method, semiconductor device and electronic device including the semiconductor device, which at least solve the above and other problems in existing semiconductor packaging technologies.

According to some embodiments, a semiconductor packaging method comprises providing at least one semiconductor device and a first carrier board. In some embodiments, each of the at least one semiconductor device respectively has an active surface and an opposing passive surface, the active surface is formed with connecting terminals, the passive surface is formed with a plurality of first alignment solder parts. In some embodiments, the first carrier board is formed with a plurality of second alignment solder parts respectively corresponding to the plurality of first alignment solder parts.

In some embodiments, the semiconductor packaging method further comprises: placing the at least one semiconductor device on the first carrier board such that the plurality of first alignment solder parts are substantially aligned with respective ones of the plurality of second alignment solder parts; forming a plurality of alignment solder joints by soldering the plurality of first alignment solder parts to respective ones of the plurality of second alignment solder parts to align and fix the at least one semiconductor device to the first carrier board; removing the first carrier board after attaching a second carrier board to the active surface of the at least one semiconductor device; forming a molded package body on a side of the second carrier board where the at least one semiconductor device is disposed, the molded package body encapsulating the at least one semiconductor device; and removing the second carrier board to expose the connecting terminals.

In some embodiments, the at least one semiconductor device includes a plurality of semiconductor devices, and forming a plurality of alignment solder joints comprises: while the plurality of semiconductor devices are aligned with the first carrier board and the plurality of alignment solder joints are in a molten or partially molten state, pressing to active surfaces of the plurality of semiconductor devices with a leveling plate to keep the active surfaces of the semiconductor devices positioned in a same plane parallel to the first carrier board until the plurality of alignment solder joints are substantially solidified, and removing the leveling plate after the plurality of alignment solder joints are substantially solidified.

In some embodiments, the at least one semiconductor device includes a plurality of semiconductor devices, the semiconductor packaging method further comprising, after forming the plurality of alignment solder joints and before removing the first carrier board, melting or partially melting the plurality of alignment solder joints, pressing a leveling plate on the active surfaces of the plurality of semiconductor devices to keep the active surfaces of the plurality of semiconductor devices substantially in a same plane parallel to the first carrier board until the plurality of alignment solder joints are substantially solidified, and removing the leveling plate after the plurality of alignment solder joints are substantially solidified.

In some embodiments, the semiconductor packaging method further comprises, before removing the first carrier board, turning over as a whole the at least one semiconductor device together with the first carrier board and the second carrier board.

In some embodiments, the semiconductor packaging method further comprises, after attaching a second carrier board to the active surface of the at least one semiconductor device and removing the first carrier board, and before forming the molded package body, turning over as a whole the at least one semiconductor device and the second carrier board.

In some embodiments, the semiconductor packaging method further comprises, after forming the package body and before removing the second carrier board, turning over as a whole the molded package body encapsulating the at least one semiconductor device together with the second carrier board.

In some embodiments, the semiconductor packaging method further comprises, after removing the second carrier board, sequentially forming an interconnect layer and external terminals on a surface of the molded package body where the connecting terminals are exposed, whereby the connecting terminals are electrically connected to the external terminals through the interconnect layer.

In some embodiments, the semiconductor packaging method further comprises, before forming the interconnect layer and the external terminals, turning over as a whole the molded package body and at least one semiconductor device encapsulated in the molded package body.

In some embodiments, the semiconductor packaging method further comprises, after the interconnect layer and the external terminals are formed, dicing the molded package body to obtain individual packages.

In some embodiments, the interconnect layer comprises a re-distribution layer and an under-bump metallization layer sequentially in a direction away from the connecting terminals.

In some embodiments, one of a respective first alignment solder part and a corresponding second alignment solder part is a solder bump, and the other of the respective first alignment solder part and the corresponding second alignment solder part is a solder pad or a solder bump.

In some embodiments, at least the first or second alignment solder parts are made of solder, and soldering is performed by melting the solder.

In some embodiments, providing at least one semiconductor device and a first carrier board includes applying viscous flux on the plurality of first alignment-solder parts and/or the plurality of second alignment solder parts. In some embodiments, forming the plurality of solder joints includes turning over as a whole the at least one semiconductor device and the first carrier board before soldering the plurality of first alignment solder parts to respective ones of the plurality of second alignment solder parts.

In some embodiments, the semiconductor packaging method further comprises, after forming the plurality of alignment solder joints, turning over as a whole the at least one semiconductor device and the first carrier board to enable the active surface to face downwards, and melting or partially melting the plurality of alignment solder joints again before cooling and solidifying the plurality of alignment solder joints again.

In some embodiments, the semiconductor packaging method further comprises, thinning the molded package body from a side near the passive surface of the at least one semiconductor device.

In some embodiments, the semiconductor packaging method further comprises, removing portions of the plurality of alignment solder joints when the first carrier board is removed or after the first carrier board is removed.

Another aspect of the present application provides a semiconductor component packaged by the above semiconductor packaging method.

Yet another aspect of the present application provides an electronic device including the semiconductor device described above.

It should be understood that the above description is only an overview of the present application so that the technical solutions of the present application can be more clearly understood and implemented according to the contents of the specification. In order to make the aforementioned and other objects, features and advantages of the present application more comprehensible, embodiments of the present application are described in detail below.

BRIEF DESCRIPTION OF THE DRAWINGS

The present embodiments are illustrated by way of example and not limitation in the figures of the accompanying drawings, in which like references indicate similar elements.

DETAILED DESCRIPTION OF THE EMBODIMENTS

The present application is intended in the following description to include at least one embodiment with reference to the accompanying drawings, in which like numerals represent the same or similar elements. Although the following description is based primarily on specific embodiments, it should be understood by those skilled in the art that the following description is intended to cover alternatives, modifications, and equivalents, which may be included within the spirit and scope of the present invention as defined by the appended claims and their equivalents, and as supported by the following description and drawings. In the following description, certain specific details are set forth, such as specific configurations, compositions, and processes, etc., to provide a thorough understanding of the present application. In other instances, well-known process and manufacturing techniques have not been described in detail to avoid unnecessarily obscuring the present application. Furthermore, the various embodiments shown in the figures are schematic representations and are not necessarily drawn to scale.

Semiconductor components (which may also be referred to as semiconductor packages) are a core component of modern electronic devices or products. Semiconductor components can be broadly classified in terms of device number and density into: discrete semiconductor devices, i.e., single chip devices, such as a single digital logic processor, diode, transistor; multi-chip components, such as a module of image sensors (CIS) and image processors (ASIC), a stack of a Central Processing Unit (CPU) and a dynamic memory (DRAM); and system level components, such as radio frequency Front End Modules (FEMs) in cell phones, display screen modules in cell phones and smart watches. Generally, the system-level package can include a wide variety of devices, including passive components (resistors, capacitors, inductors) and other devices or even components, in addition to semiconductor devices.

The semiconductor components herein may include active and passive devices including, but not limited to, active devices such as bipolar transistors, field effect transistors, integrated circuits, and passive devices such as chip resistors, capacitors, inductors, Integrated Passive Devices (IPDs), micro-electro-mechanical systems (MEMS), and the like. Various electrical connections are established between various active and passive devices to form circuits that enable the semiconductor assembly to perform high speed calculations and other useful functions.

Currently, semiconductor manufacturing typically involves two complex manufacturing processes, namely front-end wafer fabrication and back-end packaging, each of which may involve hundreds of steps. Previous wafer fabrication involves forming a plurality of chips (die) on the surface of the wafer. Each chip is generally identical and contains internally the circuits formed by the electrical connections of the active and/or passive elements. Subsequent packaging involves separating individual chips from the finished wafer and packaging them into semiconductor assemblies to provide electrical connections, structural support, heat dissipation, and environmental isolation, while facilitating subsequent assembly of the electronic product.

An important goal of semiconductor manufacturing is to produce smaller semiconductor devices, packages, and assemblies. Smaller sizes, generally higher integration, less power consumption, higher performance, and smaller area/volume, are important to the performance of the final product. In one aspect, wafer fabrication can be improved to shrink chip sizes, increase circuit density and/or improve performance. In another aspect, subsequent packaging can be improved to further reduce the sizes, increase the density, and improve the performance of the semiconductor assembly by improving the packaging design, process and packaging material.

In the back-end packaging process, a novel and efficient packaging method is the so-called fan-out packaging. Fan-out packaging is a packaging technique that wraps single or multiple qualified chips (die) from a diced wafer with a molding compound and routes interconnect traces from the chip's interconnect pads to external solder balls via a redistribution layer (RDL) to achieve higher I/O density and flexible integration. The fan-out type package may be mainly classified into a chip-first type package and a chip-last type package. Chip-first type packages can be classified into a face-down type and a face-up type.

The chip-first/face-down type packaging mainstream process comprises the following main steps: picking up chips from the cut wafer and placing the chips on a carrier board pasted with an adhesive film so that an active surface of the chips faces the adhesive film; encapsulating the chips using a molding compound; removing the carrier board (together with the adhesive film) to expose the active surface of the chip; forming an interconnect layer (including an RDL layer and Under Bump Metallization (UBM)) on an active surface of a chip; forming solder balls on the interconnect layer, wherein the interconnect pads or the interconnect bumps of the chip are electrically connected with the solder balls through the interconnect layer; and dicing to form individual semiconductor elements.

The chip-first/face-up type packaging process and the chip-first/face-down type packaging process can be approximately the same, and the main difference is as follows: picking up a chip and placing the chip on a carrier board pasted with an adhesive film, wherein the active surface of the chip is opposite to (or facing away from) the adhesive film; thinning the molded package body on one side of the active surface of the chip after encapsulation to expose the interconnect bumps on the active surface of the chip; and the carrier board may be removed after the formation of the interconnect layer and the solder balls.

Figure 1:
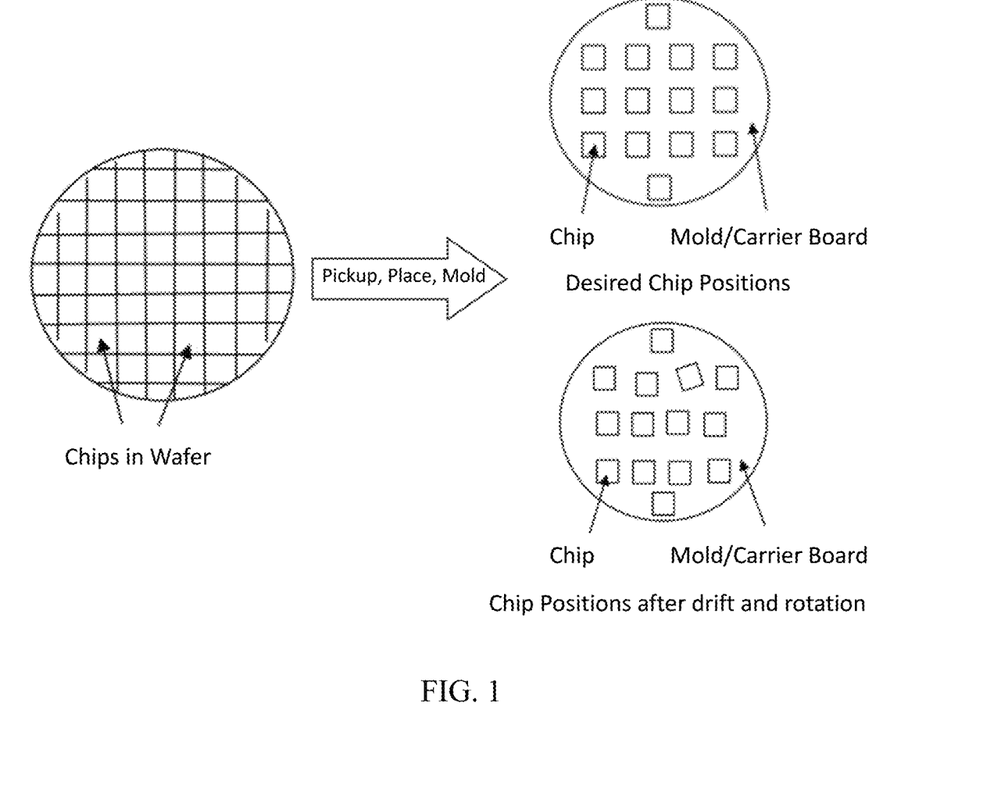
FIG. 1 is a schematic diagram illustrating a chip drift and a chip rotation phenomenon caused by a placement misalignment or a mold flow (mold flow) push during a chip-on-chip (chip-first) fan-out type package according to the related art.
Figure 2:
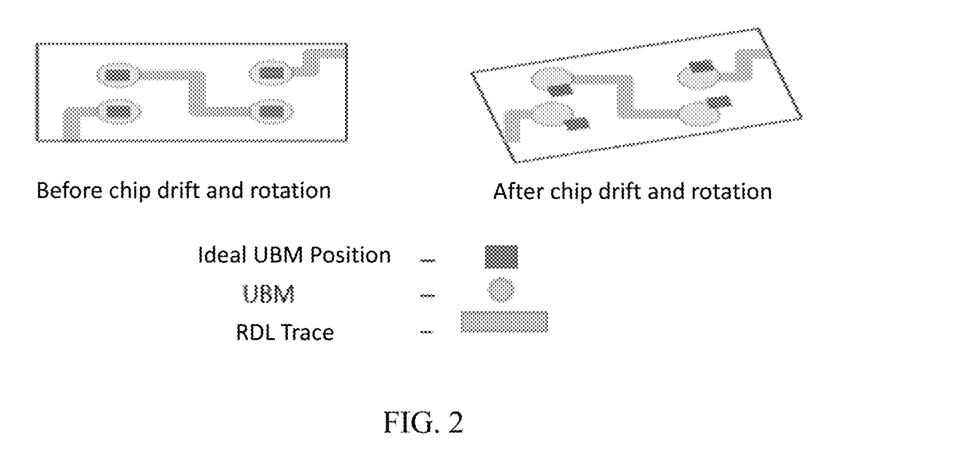
FIG. 2 shows a state diagram of Under Bump Metallization (UBM) and redistribution layer (RDL) trace position mismatch (or misalignment) formed after chip drift and rotation as shown in FIG. 1.

In the technical problem faced by the fan-out package at present, the high-precision placement and position fixing of the chip still lack an efficient and economical method. The higher the chip placement accuracy, the higher the equipment cost, the lower the production efficiency, and the more difficulty in breaking through the 0.5 micron limit of the chip mounting equipment. In addition, after a chip is placed on the adhesive film, which is used for bonding and fixing the chip, the flowing of the molding material can push the chip in the encapsulation process, so that the chip can be displaced and rotated on the adhesive film due to the deformability of the adhesive film. The higher temperatures used in the molding or encapsulation process further exacerbate this problem. Another source of chip displacement and rotation is internal stresses within the molded structure (the structure in which the chip and carrier are encapsulated d in a molding compound). Specifically, in the existing chip-first/face-down type packaging process, the encapsulation process comprises three stages: heating and injection molding, partial curing of a encapsulation material in high-temperature, and cooling, which are usually followed by a constant temperature heating step to fully cure the molding compound. The thermal expansion coefficients of the chip, the molding compound, the adhesive film, the carrier board, and the like are different, so the mismatch of the thermal expansion coefficients of various materials and the curing shrinkage of the molding compound in the encapsulation process cause uneven internal stress of the molding compound, which further causes chip drift and/or rotation (as shown in the chip arrangement at the lower right of FIG. 1) and warpage of the molded package body. Chip drift and/or rotation in turn causes positional mismatch or misalignment of subsequently formed RDL traces and UBMs (as shown in FIG. 2), which can result in a significant yield drop. The warpage of the molded package body causes difficulties in subsequent packaging processes including Under Bump Metallization (UBM) and redistribution line (RDL), and in severe cases even make it impossible to continue the process.

The present application aims to provide a novel and breakthrough packaging method that can at least solve the above technical problems.

A packaging method according to some embodiments utilizes self-alignment capability of alignment solder joints (joints) between a semiconductor device and a first carrier board in a molten or partially molten state of solder to automatically and precisely align the semiconductor device to a target position on the first carrier board and fix the position the semiconductor device after the solder is solidified In some embodiments, first alignment solder parts are pre-formed on the passive surface (i.e. the opposite surface of the active surface with interconnect terminals, which can be interconnect or contact pad, or interconnect or contact bumps) of the semiconductor device, and corresponding second alignment solder parts are formed on the first carrier board. For example, one of a first alignment solder part and a corresponding second alignment solder part can be a solder bump, while the other of the first alignment solder part and the corresponding second alignment solder part can be a solder pad or solder bump. In some embodiments, after placing the semiconductor device at the target position on the first carrier board by aligning the first alignment solder parts and the second alignment solder parts with each other, one (or both) of each respective first alignment solder part and its corresponding second alignment solder part are melted to form a respective alignment solder joint. At this point, if the semiconductor device is not precisely aligned to the target position on the first carrier board (i.e., the first alignment solder part and the corresponding second alignment solder part are not aligned), the alignment solder joint in a molten or partially molten (liquid or partially liquid) state should automatically and precisely guides the semiconductor device to the target position to achieve surface energy minimization according to the principle of minimum surface energy, and the fused alignment solder joint keeps the semiconductor device firmly fixed at the target position after solidification. The first and second alignment solder parts are optimally designed (in terms including but not limited to volume, geometry, composition, location, distribution, and number, etc.) to enable the most accurate, efficient, and reliable self-alignment capability. Fixing the semiconductor device on the first carrier board by adopting the soldering technique instead of the adhesive film bonding technique leads to many advantages. For example, the warping problem is improved, the possible drifting and rotating problems of the semiconductor device in the encapsulation process are prevented by the firm soldering joints, the placing deviation of a certain degree can be allowed when the semiconductor device is picked up and placed in view of the self-aligning capacity of the alignment solder joint, the requirement on the placing precision of the semiconductor device (especially for chip and place or die bonder) can be obviously reduced, the picking and placing operation speed of the semiconductor device can be obviously improved, the process efficiency is improved, and the process cost is reduced.

In addition, the packaging method according to some embodiments is based on aligning and fixing one side (e.g., passive surface) of at least one semiconductor device on a first carrier board by means of alignment solder joints, attaching a second carrier board to the other side (i.e. active surface) of the at least one semiconductor device, removing the first carrier board, and performing a molded encapsulation process, thereby realizing independent fixation and closed protection of the active surface of the semiconductor devices through the second carrier board when executing the molded encapsulation process. Thus, compared with existing chip-first/face-up type packaging process, the molded packaging body does not need to be thinned (by, for example, grinding) or drilled to expose the interconnect bumps or the interconnect pads after the molding or encapsulation process is performed, the efficiency of the molding or encapsulation process can be improved, accidental damage to the active surface of the semiconductor device caused by thinning (for example, grinding) or drilling processes can be avoided, and the yield can be improved.

As used herein, the term "semiconductor device" may refer to a chip (also interchangeably referred to as die, integrated circuit) produced by a chip factory (fab), i.e., a chip that has not been packaged after wafer dicing and testing, and which may typically have only interconnect pads (pads) for external connection. The semiconductor device may also be a pre-processed (at least partially packaged) chip, such as a chip with interconnect bumps (bump) formed on the interconnect pads, or may have additional structures, such as stacked chips and packaged chips, as desired.

The term "active surface" as used herein generally refers to a surface on a front side of a semiconductor device having a circuit function, including interconnect pads (or interconnect bumps formed on the interconnect pads) thereon, and may also be interchangeably referred to as a front surface or a functional surface. A surface having no circuit function on an opposing back side of the semiconductor device may be interchangeably referred to as a passive surface or a back surface.

The term "connecting terminal" as used herein generally refers to an interconnect pad or an interconnect bump on the active surface of a semiconductor device.

The term "alignment solder part" as used herein generally refers to a structure that may be aligned and soldered to a corresponding other alignment solder part for alignment by soldering methods known in the art.

Figure 3:
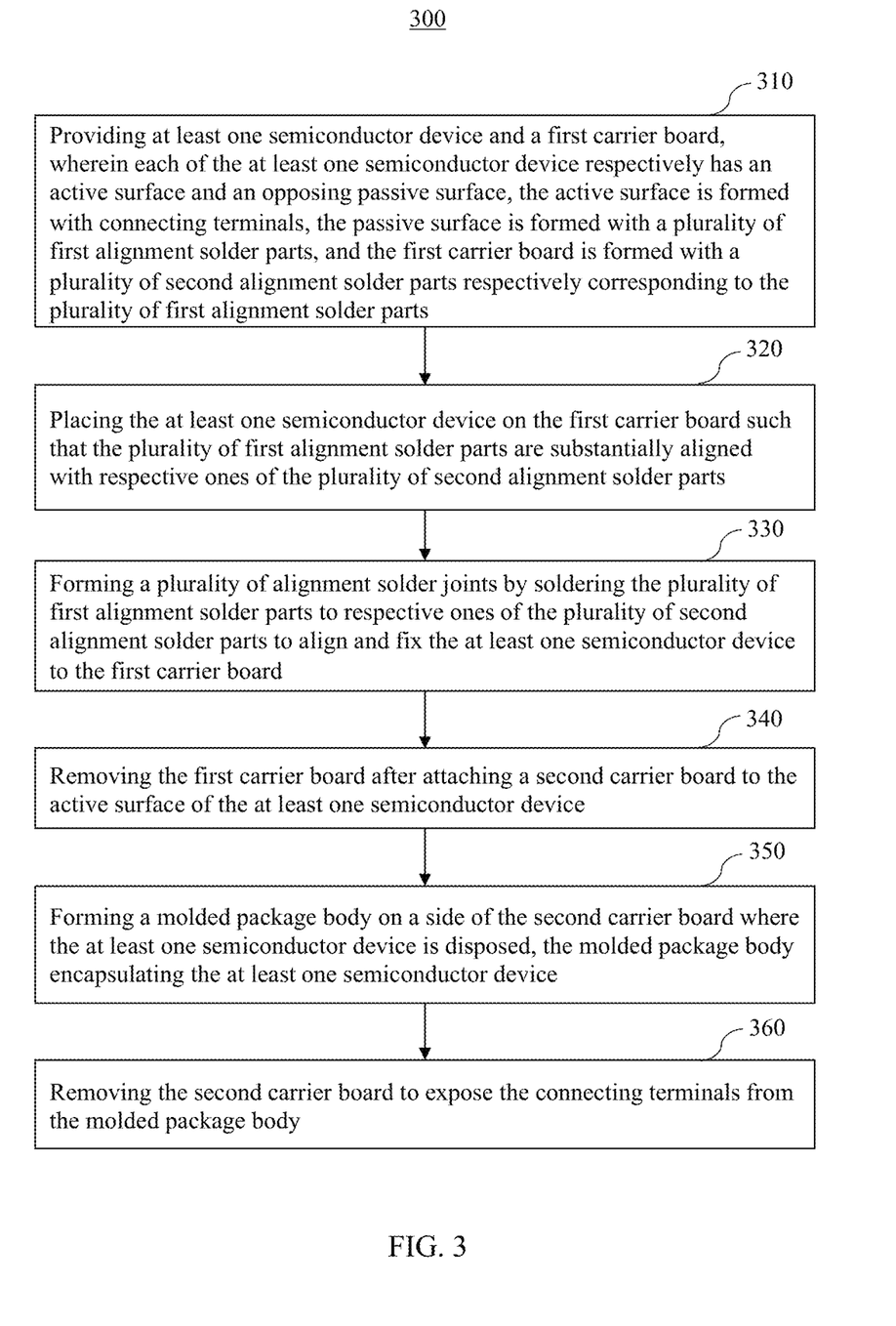
FIG. 3 shows a flow chart illustrating a packaging method according to some embodiments.

FIG. 3 shows a schematic flow diagram of a packaging method according to an embodiment of the present application. As shown in FIG. 3, the packaging method includes steps S310-S360, as described below with reference to FIGS. 4A-4I.

S310: providing at least one semiconductor device and a first carrier board, wherein the semiconductor device respectively has an active surface and a passive surface opposite to each other, the active surface is formed with connecting terminals thereon, the passive surface is formed with a plurality of first alignment solder parts thereon, and the first carrier board is formed with a plurality of second alignment solder parts respectively corresponding to the first alignment solder parts.

In some embodiments, the at least one semiconductor device includes a plurality of semiconductor devices. As an example, the plurality of semiconductor devices may include devices that are at least partially different from each other in function, size, or shape, or may be the same as each other. In some embodiments, the type and specific number of the semiconductor devices may be appropriately selected according to specific process conditions or actual requirements (for example, the size and shape of the first carrier board and the semiconductor devices, the placement pitch or package size and shape of the semiconductor devices, manufacturing process specifications, functional design of semiconductor assemblies, etc.), and the present application is not particularly limited thereto.

In some embodiments, the first carrier board or carrier is a glass carrier, a ceramic carrier, a metal carrier, an organic polymer material carrier, or a silicon wafer, or a combination of two or more of the above materials or the like.

In some embodiments, either one of a first alignment solder part and a corresponding second alignment solder part is an alignment solder bump and the other is an alignment pad corresponding to the alignment solder bump. In other embodiments, the first alignment solder part and the corresponding second alignment solder part are both alignment solder bumps, and the melting points of the first alignment solder part and the second alignment solder part can be the same or different. As an example, the alignment solder bumps may be pre-fabricated on a semiconductor device (e.g., a wafer) or a carrier using a bumping process (e.g., electroplating, ball-planting, stencil printing, evaporation/sputtering, etc.) known in the art. As an example, the alignment pad may be fabricated on the semiconductor device or the first carrier board in advance using a deposition (e.g., metal layer)—photolithography-etching process. In some embodiments, any other solder part configuration or form may be used as long as the first and second alignment solder parts are capable of being soldered to each other for alignment purposes.

In some embodiments, the first alignment solder parts and the second alignment solder parts correspond respectively to each other in volume, size, geometry, composition, distribution, location, and number, so that the semiconductor devices can be precisely aligned to the respective target positions on the carrier board by soldering to the first alignment solder parts respectively to the second alignment solder parts.

In some embodiments, the specific volume, size, geometry, composition, distribution, location and number of the first alignment solder parts and/or the second alignment solder parts may be appropriately selected according to specific process conditions or actual requirements (for example, the size and shape of the first carrier board and the semiconductor device, the placement pitch or package size and shape of the semiconductor device, etc.), and the present application is not particularly limited thereto. For example, the first alignment solder parts may be formed in substantially the same volume, size, geometry or composition for all semiconductor devices regardless of whether functions, sizes or shapes are identical to each other, and the second alignment solder parts on the first carrier board may be formed in substantially the same volume, size, geometry or composition, so as to reduce the complexity of subsequent processes and improve the packaging efficiency. For another example, for semiconductor devices with different functions, sizes or shapes, the first alignment solder parts and the second alignment solder parts may be formed with different volumes, sizes, geometries or compositions so that different bond pad heights may be formed after subsequent bonding to achieve a particular function or to meet a particular requirement. In some embodiments, for a plurality of semiconductor devices, the first alignment solder parts and/or the second alignment solder parts are configured to enable active surfaces of the plurality of semiconductor devices to lie in a same plane parallel to a surface of the first carrier board after subsequent formation of alignment solder bonds or joints.

In some embodiments, the connecting terminals are the interconnect pads. In some embodiments, the connecting terminals are interconnect bumps. By way of example, interconnect bumps may be pre-formed on interconnect pads on the semiconductor device using a bumping process known in the art (e.g., electroplating, ball-planting, stencil printing, evaporation/sputtering, etc.). For example, the interconnect bump may be in the form of a conductive pillar. In an alternative embodiment, the connecting terminal is the interconnect pad itself.

Figure 4A:
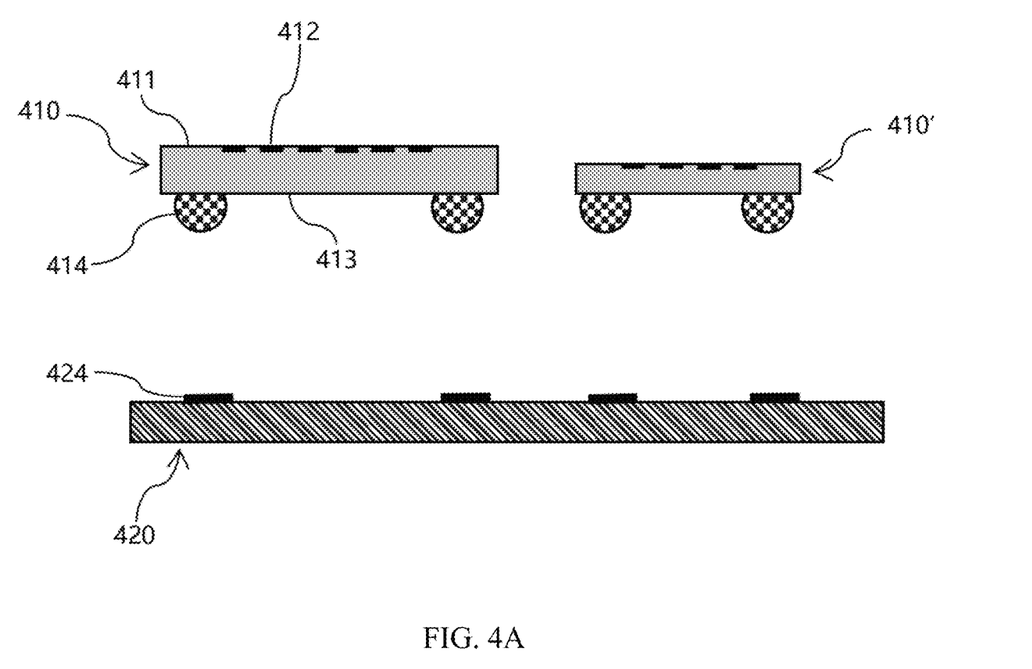
FIG. 4A to 4I show cross-sectional views for schematically illustrating a packaging method and a package according to some embodiments.

In some embodiments, as shown in FIG. 4A, a plurality of semiconductor devices and a first carrier board 420 are provided. At least two of the semiconductor devices 410, 410' are different, e.g., different in size and/or function, among the plurality of semiconductor devices. Interconnect pads 412 are formed distributed on the active surface 411 of each semiconductor device 410 (and/or 410') and a plurality of alignment solder bumps 414 are formed on the passive surface 413. A plurality of alignment pads 424 are formed on a surface of the first carrier board 420 in corresponding positions as the alignment bumps 414 on each semiconductor device 410 (and/or 410'). Alternatively, passive devices may be similarly provided in addition to semiconductor devices. For example, semiconductor device 410' shown in FIG. 4 may be replaced with a passive device.

S320: placing the at least one semiconductor device on the first carrier board 420 such that the plurality of first alignment solder parts are substantially aligned with the plurality of second alignment solder parts.

In some embodiments, "substantial alignment" may mean each first alignment solder part and the corresponding second alignment solder part contacting each other, respectively, without being precisely centered in a direction perpendicular to the passive surface. Here, "centered" is generally meant that the centers of the corresponding first and second alignment solder bumps are aligned in a direction perpendicular to the active or passive surface. It should be noted that "substantial alignment" of a first alignment solder part with the corresponding second alignment solder part means that there is at least contact between the first alignment solder part and the corresponding second alignment solder part to the extent that self-alignment is possible by virtue of the principle of minimum surface energy of the alignment solder parts in a molten or partially molten state during soldering, as described below, and thus "substantial alignment" includes a state of imprecise alignment but at least physical contact, but may not exclude a state of exact alignment.

In some embodiments, when the semiconductor device is placed on the first carrier board 420 in step S320, the passive surface of the semiconductor device faces the first carrier board 420 (i.e., the surface on which the first alignment solder part is formed), and the active surface of the semiconductor device faces away from the first carrier board 420.

Figure 4B:
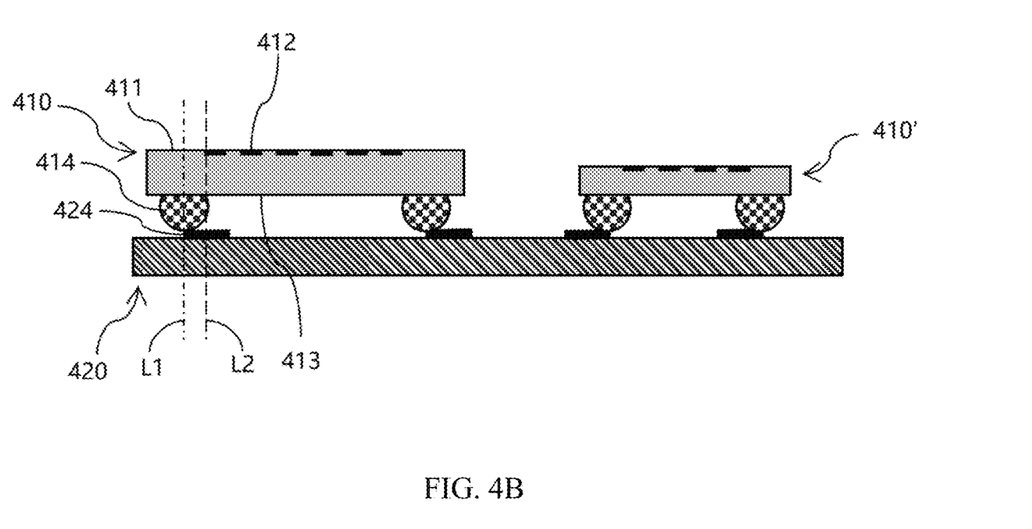

In some embodiments, as shown in FIG. 4B, semiconductor device 410 (and/or 410') is placed on the first carrier board 420 such that alignment solder bumps 414 are in contact with corresponding alignment pads 424. At this time, alignment solder bump 414 may be slightly misaligned with alignment pad 424, i.e., the vertical centerline L1 of alignment solder bump 414 and the vertical centerline L2 of alignment pad 424 are not coincident.

S330: forming a plurality of alignment solder joints by soldering the plurality of first alignment solder parts to respective ones of the plurality of second alignment solder parts so that the at least one semiconductor device is precisely aligned and fixed to the first carrier board 420.

It should be noted that "precise alignment" indicates a state where a deviation between an actual position and a target position of the semiconductor device on the first carrier board 420 is within a tolerance in the art or a preset tolerance. In some embodiments, precise alignment is achieved using the principle of minimum surface energy exhibited by the solder joint or bonds formed by soldering the first and second alignment solder parts in a molten or partially molten state during soldering. In particular, when the first alignment solder part and the second alignment solder part are in contact with each other but are not precisely centered in a direction perpendicular to the passive surface of the semiconductor device or the first carrier board 420, in the soldering process, one of the first alignment solder part and the second alignment solder part which is used as an alignment solder bump is melted or partially melted and wets the other one which is used as an alignment solder pad or another alignment solder bump, or both the first and second alignment solder parts melt or partially melt as alignment solder part bumps, thereby forming an alignment solder part in a molten or partially molten state In some embodiments, the alignment solder part in the molten or partially molten state tends to move in a deformation based on a minimum surface energy principle to bring the first alignment solder part and the second alignment solder part closer to a centered state, thereby driving the semiconductor device which is lighter relative to the first carrier board 420 to be accurately aligned to the target position on the first carrier board 420.

In some embodiments, after the first alignment solder part and the second alignment solder part are bonded to form a solder joint, the passive surface of the semiconductor device and the first carrier board 420 are spaced apart to form a certain space therebetween due to the height of the alignment solder joint itself (in a direction perpendicular to the passive surface of the semiconductor device or the first carrier board 420) formed thereby.

In some embodiments, the alignment solder bump is made of solder, and the soldering may be performed by various means known in the art for melting solder, including but not limited to reflow soldering, laser soldering, high frequency soldering, infrared soldering, and the like. By way of example, soldering may be performed using a flux or a solder paste.

Figure 4C:
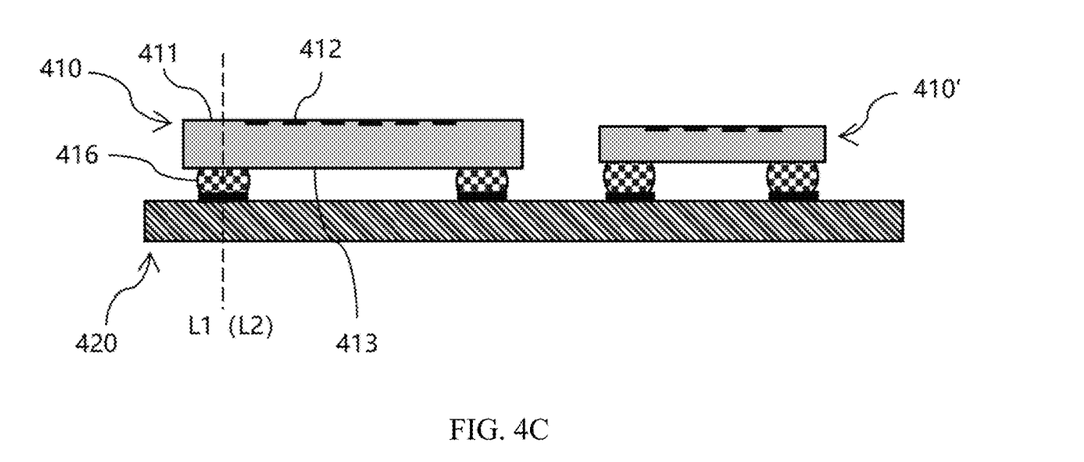

In some embodiments, alignment bonding bumps 414 and alignment solder pads 424 are bonded to form alignment solder joints 416, as shown in FIG. 4C. During the soldering process, an alignment solder bump 414 in a molten state wets the corresponding alignment pad 424 and self-aligns with the alignment pad 424 (i.e., the vertical center line L1 of the alignment solder bump 414 coincides with the vertical center line L2 of the alignment pad 424) based on its minimum surface energy principle, so that the semiconductor device 410 (and/or 410') is brought into precise alignment on the first carrier board 420. After the soldering is completed, the passive surface 413 of the semiconductor device 410 (and/or 410') is spaced apart from the first carrier board 420 to form a space therebetween.

In some embodiments, after S330, the packaging method 300 further comprises: turning over the semiconductor device and the first carrier board 420 together as a whole to enable the active surface of the semiconductor device to face downward (e.g., toward the earth), and the alignment solder joints are cooled after melting or partially melting the alignment solder joints again to solidify the alignment solder joints. In some embodiments, the alignment solder joints, which are re-melted or partially melted at this time, are moderately elongated by the weight of the semiconductor device, whereby the self-alignment accuracy can be further improved. It should be noted that the semiconductor device will not fall off the first carrier board 420 due to its own weight because of the surface energy of the alignment solder in the molten state or the partially molten state. As an alternative embodiment, in S310, viscous flux is pre-coated on the plurality of first and/or second alignment solder parts, and S330 includes: before the soldering is performed, turning over the semiconductor device and the first carrier board 420 together as a whole so that the active surface of the semiconductor device faces downward (toward the earth). In some embodiments, the alignment solder joints, which are melted or partially melted during soldering, are moderately elongated by the weight of the semiconductor device after being flipped, whereby the self-alignment accuracy can be further improved. It should be noted that, since the viscous flux adheres the semiconductor device to the first carrier, the semiconductor device would not fall off from the first carrier due to its own weight after being turned over. In some embodiments, before S340 described below, the semiconductor device and the first carrier board 420 together as a whole need to be flipped again.

In some embodiments, when the semiconductor device includes a plurality of semiconductor devices, S330 includes a leveling process to level the active surfaces of the plurality of semiconductor devices. In some embodiments, the leveling process includes using a leveling plate when the semiconductor devices are precisely aligned with the first carrier board 420 and the alignment solder joints are still in a molten or partially molten state, so that the active surfaces of the semiconductor devices are leveled with respect to each other to be basically positioned in a same plane parallel to the first carrier board 420. As an example, the leveling process includes: placing the leveling plate over the active surfaces of the plurality of semiconductor devices; pressing the leveling plate toward the first carrier board 420 such that the active surfaces of the plurality of semiconductor devices lie substantially in a same plane parallel to the first carrier board 420; while maintaining the pressing, cooling to substantially solidify the alignment solder joints; and removing the leveling plate. As an alternative embodiment, when the at least one semiconductor device includes a plurality of semiconductor devices, after S330, the packaging method 300 further comprises performing a leveling process, including: melting or partially melting the alignment solder joints again, leveling the active surfaces of the plurality of semiconductor devices using a leveling plate so that the active surfaces of the plurality of semiconductor devices are basically positioned in a same plane parallel to the first carrier board 420. As an example, the leveling process includes: melting or partially melting the alignment solder joints again; placing the leveling plate over the active surfaces of the plurality of semiconductor devices; pressing the leveling plate toward the first carrier board 420 such that the active surfaces of the plurality of semiconductor devices lie substantially in a same plane parallel to the first carrier board 420; while maintaining the pressing, cooling the assembly to substantially solidify the alignment solder joints; and removing the leveling plate. It will be appreciated that since the leveling plate is not removed until the alignment solder joint has substantially solidified, the surface energy of the molten pad is prevented from restoring the semiconductor device to its original height prior to the leveling plate.

Figure 4D:
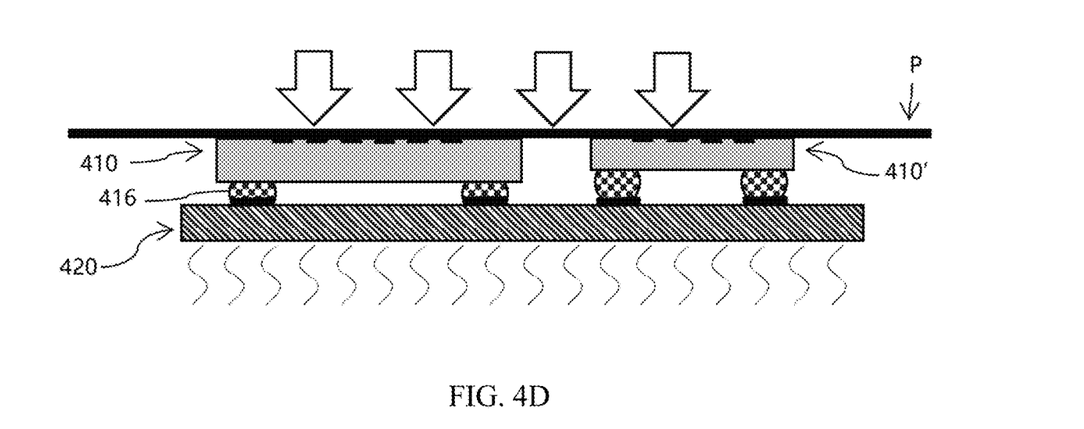

In some embodiments, as shown in FIG. 4D, after the alignment joints 416 are again brought into a molten or partially molten state by heating, and after the leveling plate P is placed on the active surfaces 411 of the plurality of semiconductor devices 410 (and/or 410'), the leveling plate P is pressed (i.e., toward the first carrier board 420) to perform a pressing or leveling process to keep the active surfaces of the plurality of semiconductor devices 410, 410' are in the same plane parallel to the first carrier board 420 while he alignment joints 416 are solidifying. The temperature is decreased while the pressing is maintained to solidify the alignment joints 416, and then the leveling plate P is removed.

Thus, the active surfaces of all semiconductor devices can be precisely flush and at the same height from the first carrier board 420. It will be appreciated that a suitable pressure needs to be applied to the leveling plate such that the alignment solder joints in the molten or partially molten state are suitably deformed and the resulting vertical (with respect to the active surface of the semiconductor device or the first carrier board 420) displacement of the leveling plate is suitable to prevent damage to the semiconductor device. As an example, a solder trap is formed in advance around each second alignment solder part of the first carrier board 420, thereby preventing uncontrolled random flow of excess molten solder during the leveling process.

In some embodiments, the leveling process using a leveling plate described above is combined with the solder process or the remelting process after the inversion described above. As an example, S330 is performed after turning over the semiconductor device and the first carrier board 420 together as a whole is performed in S330, or the leveling process is performed after S330 including turning over the semiconductor device and the first carrier board 420 together as a whole is performed, or turning over the semiconductor device and the first carrier board 420 together as a whole is performed after S330 including the leveling process is performed, or the leveling process is performed when the semiconductor device and the first carrier board 420 together as a whole is turned over, and the alignment solder joints are cooled after melting or partially melting the alignment solder joints again to solidify the alignment solder joints.

S340: removing the first carrier board 420 after attaching a second carrier board on the active surface of the at least one semiconductor device.

Figure 4E:
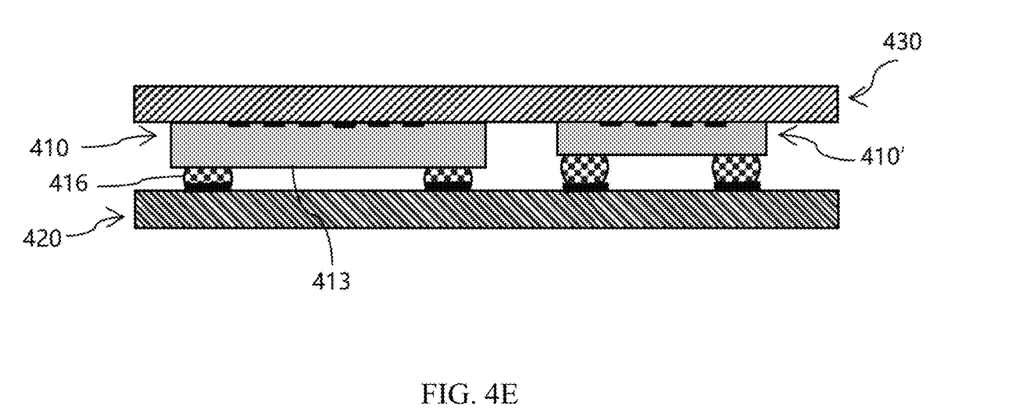

In some embodiments, as shown in FIG. 4E, the second carrier board 430 is mainly used to keep the at least one semiconductor device fixed in place after the first carrier plate is removed, so as to facilitate a subsequent molded encapsulation process. In some embodiments, the second carrier board 430 is attached by an adhesive film. However, it is understood that any attaching method may be adopted for attaching the second carrier board 430 as long as the at least one semiconductor device can be kept fixed with respect to the second carrier board 430, and the present application is not particularly limited thereto.

In some embodiments, the second carrier board 430 is made of glass, ceramic, metal, organic polymer material, or silicon wafer, or a combination of two or more of the above materials.

In some embodiments, the first carrier board 420 is removed by lift-off, etching, ablation, grinding, or the like, as known in the art. As an example, when a lift-off process is employed, the solder between the first carrier board 420 and the semiconductor device (i.e., the alignment solder joints) may be de-soldered to facilitate the lift-off of the first carrier board 420 from the passive surfaces of the semiconductor devices.

In some embodiments, when or after removing the first carrier board 420, some or all of the alignment solder joints are also removed. By way of example, some or all of the alignment solder joints may be removed by desoldering, etching, ablating, grinding, or another process among other processes known in the art. In some embodiments, part or all of the alignment solder joints are left as part of the final semiconductor assembly (i.e., the finished package) for electrical connections (e.g., power and ground), heat sinking, mechanical structures, etc.

Figure 4F:
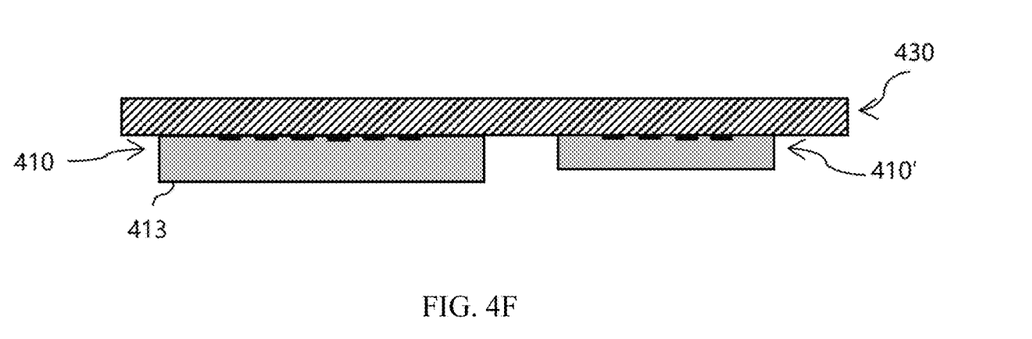

As an exemplary embodiment, after attaching the second carrier board 430 on the active surface 411 of the semiconductor device 410 (and/or 410'), as shown in FIG. 4E, the first carrier board 420 and the alignment pads 416 are removed from the side of the passive surface 413 of the semiconductor device 410 (and/or 410') by desoldering the alignment solder joints 416, as shown in FIG. 4F.

S350: forming a molded package body on a side of the second carrier board 430 where the at least one semiconductor device is disposed, the molded package body encapsulating the at least one semiconductor device. In some embodiments, the molding encapsulation is performed using a molding compound of a resinous material (e.g., epoxy).

In some embodiments, the passive surfaces and sides of the semiconductor device are embedded by the encapsulation in the molded package body.

In some embodiments, the packaging method further comprises turning over as a whole the at least one semiconductor device, the first carrier board 420 and the second carrier board 430 before removing the first carrier board 420. In some embodiments, the packaging method further comprises, before forming the molded package body, the at least one semiconductor device and the second carrier plate together as a whole are turned over.

Figure 4G:
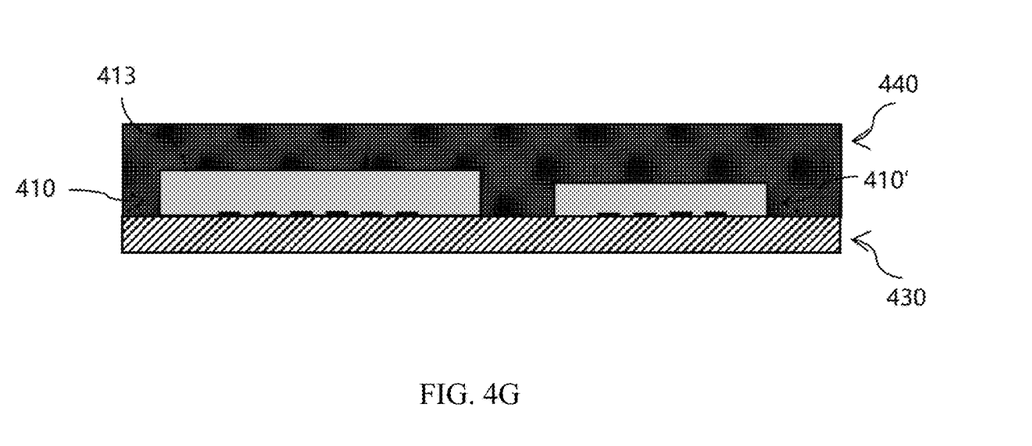

In some embodiments, as shown in FIG. 4G, the semiconductor device 410 (and/or 410') and the second carrier board 430 together as a whole are turned over such that the passive surface 413 of the semiconductor device 410 (and/or 410') faces upward and the second carrier board 430 is below the semiconductor device 410 (and/or 410'), before molding is performed above the second carrier board 430 (i.e., the side to which the semiconductor device 410 (and/or 410') is attached), such that the molded package body 440 covers the passive surface and the sides of the semiconductor device 410 (and/or 410').

S360: removing the second carrier plate to expose the connecting terminals.

In some embodiments, the second carrier plate is removed by stripping, etching, ablating, grinding, or the like, as known in the art.

Figure 4H:
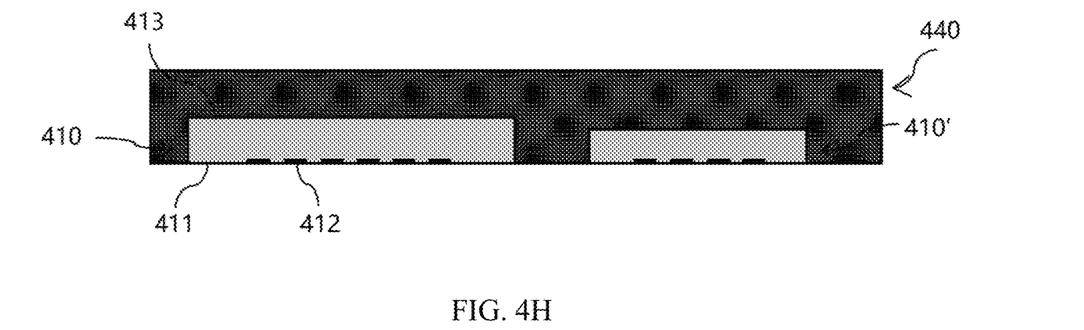

In some embodiments, as shown in FIG. 4H, the active surfaces 411 (e.g., the interconnection pads 412) of the semiconductor devices 410 (and/or 410') are exposed after removing the second carrier board 430.

In some embodiments, the packaging method further comprises, after removing the second carrier board 430, sequentially forming a redistribution layer and external terminals on a surface of the molded package body, where the interconnect terminals are exposed, whereby the interconnect terminals are electrically coupled to the external terminals through the redistribution layer.

In some embodiments, the packaging method further comprises: before removing the second carrier plate, turning over as a whole the second carrier plate and the molded package body with the at least one semiconductor device encapsulated therein. In some embodiments, before the redistribution layer and the external terminals are formed, the molded package body encapsulating the at least one semiconductor device is turned over.

In some embodiments, the interconnect layer includes a redistribution layer (RDL) and an Under Bump Metallization (UBM) in this order in a direction away from the connecting terminal, thereby achieving conductive connection of the connecting terminal with the external terminal. In some embodiments, the interconnect layer further includes an insulating layer for achieving electrical insulation between the conductive paths, and the specific number and material of the insulating layer may be appropriately selected according to specific process conditions or needs, which is not particularly limited in the present application.

In some embodiments, the external terminals are solder balls or solder pads.

Figure 4I:
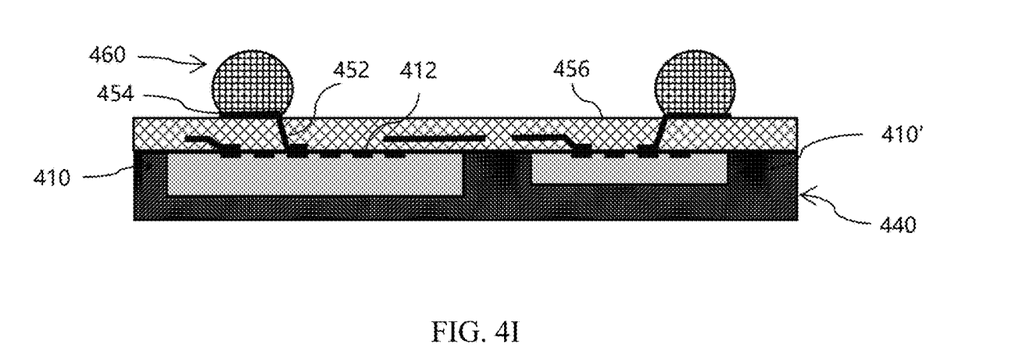

In some embodiments, as shown in FIG. 4I, the molded package body 440 with the semiconductor device(s) 410 (and/or 410') encapsulated therein is turned over so that the exposed active surface(s) 413 (i.e., the interconnect pads 412) of the semiconductor device(s) 410 (and/or 410') face upward. Then, a redistribution layer (RDL) 452, a UBM 454, and solder balls 460 are sequentially formed from bottom to top on the surface of the molding compound 440 where the interconnect pads 412 are exposed, to form conductive paths from the interconnect pads 412 to the corresponding solder balls 460. In this process, a dielectric layer 456 is also formed to achieve electrical isolation between the conductive paths, particularly when forming RDL traces 452 and/or UBM 454.

In some embodiments, the packaging method further comprises: thinning (such as grinding, etching or ablating or the like) the molded package body from the side near the passive surfaces of the at least one semiconductor device. In some embodiments, thinning the molded package body may be performed after removing the second carrier board 430 and before forming the RDL traces. In some embodiments, thinning the package body may be performed after forming the RDL traces and external terminals As an example, the package body may be thinned to the passive surface of the semiconductor device, or the thinned portion comprises a portion of the semiconductor device on the passive surface side of the semiconductor device. In some embodiments, the alignment pads remaining after the carrier board is removed may also be removed by the thinning process. This can further reduce the thickness of the final semiconductor module.

In some embodiments, passive devices are also packaged with the semiconductor device in substantially the same manner as the embodiments described above.

In some embodiments, the packaging method further comprises, after forming the RDL traces and external terminals, dicing the package body to obtain individual packages.

It should be understood that the dicing process may be performed to fabricate individual semiconductor devices or not performed according to the packaging specifications of the semiconductor devices, including but not limited to wafer level packaging, chip level packaging, system level packaging, etc.

It is apparent that those skilled in the art can make various changes and modifications to the embodiments of the present application without departing from the spirit and scope of the application. Thus, to the extent that such modifications and variations fall within the scope of the claims and their equivalents, it is intended that the present disclosure encompass such modifications and variations as well.

What is claimed is:

1. A semiconductor packaging method, comprising:
providing at least one semiconductor device and a first carrier board, wherein each of the at least one semiconductor device respectively has an active surface and an opposing passive surface, the active surface is formed with connecting terminals, the passive surface is formed with a plurality of first alignment solder parts, and the first carrier board is formed with a plurality of second alignment solder parts respectively corresponding to the plurality of first alignment solder parts;
placing the at least one semiconductor device on the first carrier board such that the plurality of first alignment solder parts are substantially aligned with respective ones of the plurality of second alignment solder parts;
forming a plurality of alignment solder joints by soldering the plurality of first alignment solder parts to respective ones of the plurality of second alignment solder parts to align and fix the at least one semiconductor device to the first carrier board;
removing the first carrier board after attaching a second carrier board to the active surface of the at least one semiconductor device;
forming a molded package body on a side of the second carrier board where the at least one semiconductor device is disposed, the molded package body encapsulating the at least one semiconductor device; and
removing the second carrier board to expose the connecting terminals.

2. The semiconductor packaging method according to claim 1, wherein the at least one semiconductor device includes a plurality of semiconductor devices, and forming a plurality of alignment solder joints comprises: while the plurality of semiconductor devices are aligned with the carrier board and the plurality of alignment solder joints are in a molten or partially molten state, pressing the active surfaces of the plurality of semiconductor devices with a leveling plate to keep the active surfaces of the semiconductor devices positioned in a same plane parallel to the carrier board until the plurality of alignment solder joints are substantially solidified, and removing the leveling plate after the plurality of alignment solder joints are substantially solidified.

3. The semiconductor packaging method according to claim 1, wherein the at least one semiconductor device includes a plurality of semiconductor devices, the semiconductor packaging method further comprising, after forming the plurality of alignment solder joints and before removing the first carrier board, melting or partially melting the plurality of alignment solder joints, pressing a leveling plate on the active surfaces of the plurality of semiconductor devices to keep the active surfaces of the plurality of semiconductor devices substantially in a same plane parallel to the carrier board until the plurality of alignment solder joints are substantially solidified, and removing the leveling plate after the plurality of alignment solder joints are substantially solidified.

4. A semiconductor packaging method according to claim 1, further comprising, before removing the first carrier board, turning over as a whole the at least one semiconductor device together with the first carrier board and the second carrier board.

5. A semiconductor packaging method according to claim 1, further comprising, after attaching a second carrier board to the active surface of the at least one semiconductor device and removing the first carrier board, and before forming the molded package body, turning over as a whole the at least one semiconductor device and the second carrier board.

6. A semiconductor packaging method according to claim 1, further comprising, after forming the package body and before removing the second carrier board, turning over as a whole the molded package body encapsulating the at least one semiconductor device together with the second carrier board.

7. A semiconductor packaging method according to claim 1, further comprising, after removing the second carrier board, sequentially forming an interconnect layer and external terminals on a surface of the molded package body where the connecting terminals are exposed, whereby the connecting terminals are electrically connected to the external terminals through the interconnect layer.

8. A semiconductor packaging method according to claim 7, further comprising, before forming the interconnect layer and the external terminals, turning over as a whole the molded package body and at least one semiconductor device encapsulated in the molded package body.

9. A semiconductor packaging method according to claim 7, further comprising: after the interconnect layer and the external terminals are formed, dicing the molded package body to obtain individual packages.

10. A semiconductor packaging method according to claim 7, wherein the interconnect layer comprises a redistribution layer and an under-bump metallization layer sequentially formed in a direction away from the connecting terminals.

11. A semiconductor packaging method according to claim 1, wherein one of a respective first alignment solder part and a corresponding second alignment solder part is a solder bump, and the other of the respective first alignment solder part and the corresponding second alignment solder part is a solder pad or a solder bump.

12. A semiconductor packaging method according to claim 11, wherein at least the first or second alignment solder parts are made of solder, and soldering is performed by melting the solder.

13. A semiconductor packaging method according to claim 12, wherein providing at least one semiconductor device and a first carrier board includes applying viscous flux on the plurality of first alignment-solder parts and/or the plurality of second alignment solder parts, and wherein forming the plurality of solder joints includes turning over as a whole the at least one semiconductor device and the first carrier board before soldering the plurality of first alignment solder parts to respective ones of the plurality of second alignment solder parts.

14. A semiconductor packaging method according to claim 12, further comprising, after forming the plurality of alignment solder joints, turning over as a whole the at least one semiconductor device and the first carrier board to enable the active surface to face downwards, and melting or partially melting the plurality of alignment solder joints again whereby the plurality of alignment solder joints are elongated by weight of the at least one semiconductor device, before cooling and solidifying the plurality of alignment solder joints again.

15. A semiconductor packaging method according to claim 1, further comprising thinning the molded package body from a side near the passive surface of the at least one semiconductor device.

16. A semiconductor packaging method according to claim 1, further comprising: removing portions of the plurality of alignment solder joints when the first carrier board is removed or after the first carrier board is removed.

17. A semiconductor component made by the semiconductor packaging method according to claim 1.

18. An electronic device comprising the semiconductor component of claim 17.

* * * * *